(12) United States Patent
Takeichi et al.

(10) Patent No.: US 6,673,858 B2
(45) Date of Patent: Jan. 6, 2004

(54) THERMOSETTING ADHESIVE MATERIAL

(75) Inventors: Motohide Takeichi, Kanuma (JP); Hidekazu Yagi, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/728,074

(22) Filed: Dec. 4, 2000

(65) Prior Publication Data

US 2001/0020697 A1 Sep. 13, 2001

(30) Foreign Application Priority Data

Dec. 9, 1999 (JP) .............................. 11-350800

(51) Int. Cl.$^7$ ................................. C08K 3/18
(52) U.S. Cl. ...................... 524/430; 524/431
(58) Field of Search ................ 524/430, 431

(56) References Cited

U.S. PATENT DOCUMENTS

| | | | | | |
|---|---|---|---|---|---|
| 4,581,158 A | * | 4/1986 | Lin | ........................ | 252/511 |
| 4,689,395 A | * | 8/1987 | Bergmann | ................ | 528/374 |
| 6,054,509 A | * | 4/2000 | Arai | .......................... | 523/428 |
| 6,248,204 B1 | * | 6/2001 | Schuft | ....................... | 156/305 |
| 6,254,301 B1 | * | 7/2001 | Hatch | ........................ | 403/298 |
| 6,338,767 B1 | * | 1/2002 | Nakatani | .................... | 156/233 |
| 6,355,750 B1 | * | 3/2002 | Herr | ............................ | 526/262 |

* cited by examiner

Primary Examiner—Edward J. Cain
(74) Attorney, Agent, or Firm—Oliff & Berridge, PLC

(57) ABSTRACT

A thermosetting adhesive material for connecting connection terminals provided on the opposing sides of a pair of opposing substrates, contains a thermosetting resin and an insulating inorganic filler, wherein the insulating inorganic filler content (a; vol %) and the elastic modulus of the thermosetting adhesive material after curing (E; GPa/30° C.) satisfy the following relational formula (1):

$$0.042a + 0.9 < E < 0.106a + 2.5 \qquad (1)$$

and at the same time, the insulating inorganic filler content (a; vol %) and the tensile elongation (d; %) at 25° C. of the thermosetting adhesive material after curing satisfy the following relational formula (2)

$$-0.072a + 4 < d < -0.263a + 13 \qquad (2).$$

7 Claims, 1 Drawing Sheet

THERMOSETTING ADHESIVE MATERIAL

BACKGROUND OF THE INVENTION

1. Field of the Invention

The present invention relates a thermosetting adhesive material for connecting connection terminals provided on the opposing sides of a pair of opposing substrates.

2. Description of the Related Art

Electronic devices, primarily portable terminal devices and the like, have been getting lighter, thinner, shorter and smaller while incorporating high functions in recent years. Correspondingly mounting areas in these devices have become narrow. Consequently, the direct flip-chip mounting of bare IC chips on IC mounting substrates, and the working of the chips into the form of a chip-size package (CSP) are now being performed.

Such mounting generally involves the use of a thermosetting adhesive material in the form of a film, paste, or liquid, which contains a thermosetting resin such as an epoxy resin and a curing agent as its primary components, and which further contains electroconductive particles for anisotropic electroconductive connection as needed.

More recently, there have been attempts at reducing the coefficient of linear expansion of a cured adhesive material to bring this coefficient closer to that of the material being bonded (such as an IC chip or wiring substrate) by adding an insulating inorganic filler such as alumina or silica in order to enhance the connection reliability of a thermosetting adhesive material such as this.

If an insulating inorganic filler is simply added, however, there will be a drop in toughness parameters, such as a decrease in elongation or an increase in the elastic modulus of the cured adhesive material, which is a problem in that the connection reliability actually suffers.

SUMMARY OF THE INVENTION

It is an object of the present invention to solve the above problems encountered with prior art, and to be able to add an insulating inorganic filler to a thermosetting adhesive material for connecting connection terminals provided on the opposing sides of a pair of opposing substrates, without diminishing the toughness parameters of this material.

The inventors arrived at the present invention upon discovering that the stated object could be achieved by adjusting the elastic modulus of a cured thermosetting adhesive material so as to maintain a specific relationship with respect to the insulating inorganic filler content (vol %).

Specifically, the present invention provides a thermosetting adhesive material for connecting connection terminals provided on the opposing sides of a pair of opposing substrates, said thermosetting adhesive material containing a thermosetting resin and an insulating inorganic filler, wherein the insulating inorganic filler content (a; vol %) and the elastic modulus of the thermosetting adhesive material after curing (E; GPa/30° C.) satisfy the following relational formula (1):

$$0.042a+0.9<E<0.106a+2.5 \qquad (1)$$

and at the same time, the insulating inorganic filler content (a; vol %) and the tensile elongation (d; %) at 25° C. of the thermosetting adhesive material after curing satisfy the following relational formula (2).

$$-0.072a+4<d<-0.263a+13 \qquad (2)$$

DESCRIPTION OF THE PREFERRED EMBODIMENTS

Figure 1:
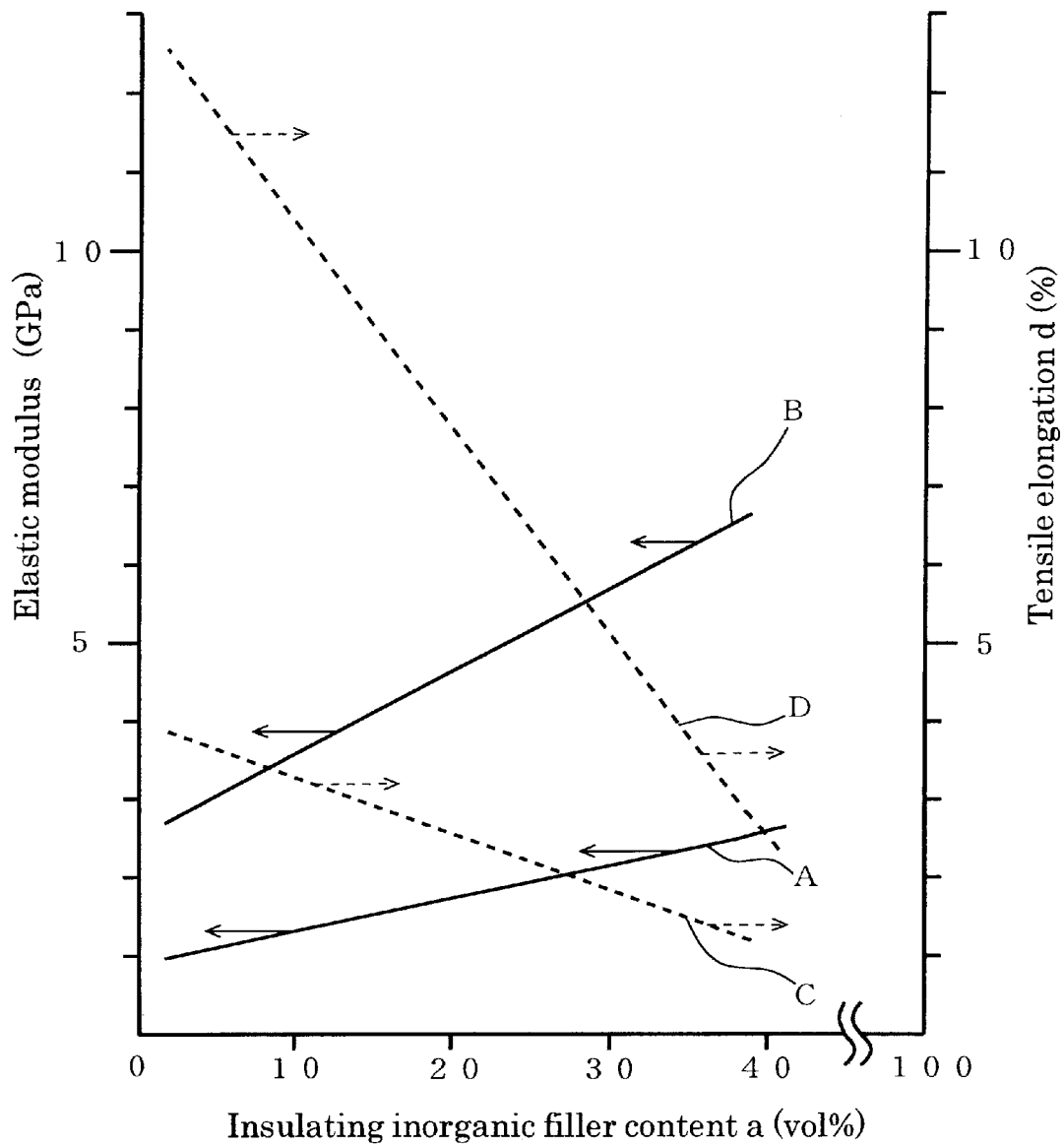
FIG. 1 is a graph of the insulating inorganic filler content versus the elastic modulus and tensile elongation in a thermosetting adhesive material.

The present invention will now be described in detail.

The object of the thermosetting adhesive material of the present invention is to connect connection terminals provided on the opposing sides of a pair of opposing substrates (such as a bare IC chip and its mounting substrate, or a driver IC and a glass substrate for a liquid crystal display element), and contains at least one type of thermosetting resin and at least one type of insulating inorganic filler.

In the thermosetting adhesive material of the present invention, the insulating inorganic filler content (a; vol %) and the elastic modulus of the thermosetting adhesive material after curing (E; GPa/30° C.) satisfy the following relational formula (1):

$$0.042a+0.9<E<0.106a+2.5 \qquad (1)$$

Specifically, as is clear from FIG. 1, in which Relational Formula (1) is plotted, the insulating inorganic filler content and the elastic modulus of the thermosetting adhesive material after curing in the thermosetting adhesive material of the present invention are selected so as to be located within the region bounded by line A and line B. This is because in the region below line A, the cohesive strength is not high enough to prevent the connected terminals (connected by hot pressing) from being disconnected by external stress, so the material will fail a reliability test, but in the region above line B, the elastic modulus is too high, a large amount of interfacial stress is generated when the connection terminals are bonded together, and separation and so forth tend to occur in the reliability test.

In the present invention, at the same time that Relational Formula (1) is satisfied, the insulating inorganic filler content (a; vol %) and the tensile elongation (d; %) at 25° C. of the thermosetting adhesive material after curing satisfy the following relational formula (2).

$$-0.072a+4<d<-0.263a+13 \qquad (2)$$

Specifically, as is clear from FIG. 1, in which Relational Formula (2) is plotted, the insulating inorganic filler content and the tensile elongation of the thermosetting adhesive material after curing in the thermosetting adhesive material of the present invention are selected so as to be located within the region bounded by line C and line D. This is because in the region below line C, stress generated at the adhesive interface cannot be sufficiently dispersed, so the material will fail a reliability test, but in the region above line D, the elongation is too great, and the connection terminals cannot be maintained in a connected state in the face of external stress.

With the present invention, connection reliability cannot be adequately improved if the insulating inorganic filler content (a; vol %) is too small, but if the content is too large, the viscosity of the thermosetting adhesive material prior to curing will be excessively high, making the material difficult to work with, so the content should be between 5 and 35 vol %. The phrase "content (a; vol %)" as used here means the amount contained in the solids of the thermosetting adhesive material.

The insulating inorganic filler can be any such filler used in conventional thermosetting adhesive materials, but alumina and silica are especially favorable from the standpoints of chemical stability and cost.

The average particle diameter of this insulating inorganic filler will vary with the type of substrate to be connected, the shape of the connection terminals provided on the substrate, and other factors, but is usually 0.1 to 20 μm, and preferably 0.3 to 10 μm. When electroconductive particles for anisotropic electroconductive connection are added (discussed below), they must be larger than the filler particles.

Any resin used in conventional thermosetting adhesive materials can be used as the thermosetting resin used in the thermosetting adhesive material of the present invention. Examples thereof include epoxy resins, urethane resins, and unsaturated polyester resins. This thermosetting resin may also have photoreactive functional groups such as acrylic ester residues or methacrylic ester residues.

If the amount in which the thermosetting resin is contained in the thermosetting adhesive material is too small, the adhesive strength of the thermosetting adhesive material will be insufficient and connection reliability will decrease, but if it is too large, the insulating inorganic filler content will be relatively smaller, and again connection reliability will decrease, so this amount should be between 5 and 90 wt %, and preferably 10 and 70 wt %.

It is preferable for the thermosetting adhesive material of the present invention to contain a curing agent that will react with the thermosetting resin, and a latent curing agent is particularly favorable. Examples include imidazole-based curing agents, acid anhydride-based curing agents, hydrazide-based curing agents, and dicyandiamide-based curing agents.

The amount in which the curing agent is contained in the thermosetting adhesive material is preferably 1 to 50 weight parts, and even more preferably 5 to 30 weight parts, per 100 weight parts of thermosetting resin.

The thermosetting adhesive material of the present invention can also be an anisotropic electroconductive adhesive material containing electroconductive particles for anisotropic electroconductive connection. If so, the electroconductive particles should be contained in the thermosetting adhesive material in a proportion of 0.5 to 20 vol %, and preferably 1 to 15 vol %.

Any electroconductive particles that have been used as known anisotropic electroconductive adhesives can be used as these electroconductive particles for anisotropic electroconductive connection. Examples thereof include solder particles, nickel particles, and other such metal particles, composite particles in which the surface of a core resin is plated with metal, and particles in which an insulating resin thin layer is formed on the surface of one of the above types of particles.

The thermosetting adhesive material of the present invention can be prepared by thoroughly mixing a thermosetting resin and an insulating inorganic filler, along with electroconductive particles and a curing agent, in a solvent (such as toluene) if needed. This product may be used directly in the form of a liquid or paste, or it can be made into a film and used as a thermosetting adhesive film.

The thermosetting adhesive material of the present invention is sandwiched between the connection terminals provided on the opposing sides of a pair of opposing substrates, and then hot pressed, which allows these connection terminals to be connected while affording good conductivity characteristics, insulation characteristics, and connection strength to be achieved.

EXAMPLES

The present invention will now be described in more specific terms through the following examples.

Examples 1 to 6, Comparative Examples 1 to 6

Resin components in the compositions shown in Tables 1 and 2 were mixed with toluene to a solids concentration of 70%, a filler was admixed and dispersed with a triple-roll kneader, and a curing agent was added and mixed, which gave a thermosetting adhesive material.

The thermosetting adhesive material thus obtained was applied to a release PET film so that the dry thickness would be 40 μm, and this coating was dried in a circulating hot air oven to produce a thermosetting adhesive film.

The thermosetting adhesive film thus obtained was evaluated for connection reliability as described below, and the tensile elongation and elastic modulus were also measured.

Connection Reliability

A silicon IC chip (6.3 mm square by 0.4 mm thick), which is provided on its back with 160 gold plating bumps with a height of 20 μm (height $h^1$=20 μm/150 μm pitch), and a glass epoxy substrate (40 mm square by 0.6 mm thick), on which nickel/gold-plated copper wiring (thickness (electrode height) $h^2$=12 μm) had been formed, were aligned, between which was disposed the thermosetting adhesive film obtained from each of the Examples and Comparative Examples which had been peeled from its release PET film, and were connected by use of a flip-chip bonder (connection conditions: 180° C., 20 seconds, 100 g/bump), to give a connection structure.

Upon completion of the connection, the connection structures were allowed to stand for 186 hours in an atmosphere of 30° C. and 70% RH, and then passed twice through a 240° C. (max) reflow furnace. The resistance at the connections was then measured by four probe method. After this measurement, the connection structures were subjected to a pressure cooker treatment (PCT) (121° C., 2.1 atm, 100% RH) for 200 hours, after which the resistance at the connections was again measured. The results thus obtained are given in Tables 3 and 4.

Tensile Elongation and Elastic Modulus

A cutter knife was used to cut the uncured thermosetting adhesive film to a size of 1 cm wide by 15 cm long, and this product was cured for 15 minutes in a 180° C. circulating hot air oven, after which the release PET film was peeled away. The reason for not using the cutter knife after curing is to avoid producing microcracks.

The tensile elongation of the film thus obtained was measured with a tensile tester (Autograph AGS-H/video style elongation gauge DVE-200, made by Shimadzu) (measurement conditions: pulling rate 1 mm/min; chuck distance=10 cm; benchmark distance=5 cm; measurement temperature=25° C.). The elastic modulus was calculated from the slope between strain values of 0.05% and 0.25% on a stress-strain curve obtained using a tensile tester. The measurement results and calculation results thus obtained are given in Tables 3 and 4. The insulating inorganic filler content (vol %) is also given in Tables 3 and 4.

Table 5 shows the range of the elastic modulus E (GPa/30° C.) of Formula 1 and the range of the tensile elongation d (%) of Formula 2 with respect to the insulating inorganic filler content (vol %) in the examples and comparative examples (5.7%, 16%, 19%, 35%).

TABLE 1

| Components | Example (weight parts) | | | | | |
|---|---|---|---|---|---|---|
| | 1 | 2 | 3 | 4 | 5 | 6 |
| Phenoxy resin*[1] | 30 | 30 | 30 | 20 | 20 | 30 |
| Epoxy resin*[2] | 20 | 20 | 20 | — | — | 20 |
| Epoxy resin*[3] | — | — | — | 20 | 20 | — |
| Polybutadiene rubber fines*[4] | 10 | 10 | 10 | 10 | 10 | 10 |
| Acrylic resin*[5] | — | — | — | 10 | 10 | — |
| Imidazole-based curing agent*[6] | 40 | 40 | 40 | 40 | 40 | 40 |
| Insulating inorganic filler | | | | | | |
| Silica particles*[7] | 10 | 30 | 50 | 10 | 30 | 50 |
| $CaCO_3$ particles*[8] | — | — | — | — | — | — |
| Electroconductive particles*[9] | — | — | — | — | — | 12 |

Notes for Tables 1 and 2:
*[1]YP50, made by Toto Kasei
*[2]4032D, made by Dainippon Ink & Chemicals, Ltd.
*[3]YD128, made by Toto Kasei
*[4]Made by Kuraray Co., Ltd.
*[5]SG80, made by Fujikura Kasei Co., Ltd.
*[6]3941HP, made by Asahi Chemical Industry Co., Ltd.
*[7]SOE2, made by Tatsumori
*[8]Whitone SB, made by Shiraishi Calcium Co., Ltd.
*[9]EH20GNR, made by Nippon Chemical Industries

TABLE 2

| Components | Comparatice Example (weight parts) | | | | | |
|---|---|---|---|---|---|---|
| | 1 | 2 | 3 | 4 | 5 | 6 |
| Phenoxy resin*[1] | 20 | 35 | 35 | 20 | 20 | 20 |
| Epoxy resin*[2] | — | 25 | 25 | 40 | — | — |
| Epoxy resin*[3] | 20 | — | — | — | 30 | 30 |
| Polybutadiene rubber fines*[4] | 10 | — | — | — | 10 | 10 |
| Acrylic resin*[5] | 10 | — | — | — | 40 | 40 |
| Imidazole-based curing agent*[6] | 40 | 40 | 40 | 40 | — | — |
| Insulating inorganic filler | | | | | | |
| Silica particles*[7] | — | 10 | 50 | 10 | 10 | 50 |
| $CaCO_3$ particles*[8] | 30 | — | — | — | — | — |
| Electroconductive particles*[9] | — | — | — | — | — | — |

TABLE 3

| Evaluation category | Example | | | | | |
|---|---|---|---|---|---|---|
| | 1 | 2 | 3 | 4 | 5 | 6 |
| Insulating inorganic filler (vol %) | 5.7 | 19 | 35 | 5.7 | 19 | 35 |
| Elastic modulus E (GPa) | 3.0 | 4.3 | 5.7 | 1.2 | 1.8 | 5.7 |
| Tensile elongation d (%) | 4.8 | 3.2 | 2.0 | 9.6 | 5.9 | 1.8 |
| Initial resistance value (mΩ) | 8 | 8 | 8 | 8 | 8 | 13 |
| Resistance after PCT (mΩ) | 10 | 10 | 9 | 9 | 10 | 13 |

TABLE 4

| Evaluation category | Comparative Example | | | | | |
|---|---|---|---|---|---|---|
| | 1 | 2 | 3 | 4 | 5 | 6 |
| Insulating inorganic filler (vol %) | 16 | 5.7 | 35 | 5.7 | 5.7 | 35 |
| Elastic modulus E (GPa) | 1.6 | 3.1 | 6.2 | 3.4 | 1.2 | 2.5 |
| Tensile elongation d (%) | 1.8 | 1.5 | 1.2 | 1.1 | 16.8 | 7.2 |
| Initial resistance value (mΩ) | 8 | 8 | 8 | 8 | 8 | 8 |
| Resistance after PCT (mΩ) | 245 | 68 | 47 | 56 | 302 | 195 |

TABLE 5

| Insulating in-Organic Filler (vol %) | Range | |
|---|---|---|
| | elastic modulus of Formula (1) | tensile elongation of Formula (2) |
| 5.7 | 1.14–3.10 | 3.59–11.50 |
| 16 | 1.57–4.20 | 2.85–8.79 |
| 19 | 1.70–4.51 | 2.63–8.00 |
| 35 | 2.37–6.21 | 1.48–3.80 |

As can be seen from Tables 3 to 5, the insulating inorganic filler content and the elastic modulus satisfy Relational Formula 1, and at the same time, the insulating inorganic filler content and the tensile elongation satisfy Relational Formula 2, when the thermosetting adhesive materials of Examples 1 to 6 are used. Accordingly, it can be seen that there is virtually no change in the initial resistance value or the resistance value after 200 hours of PCT, with good connection reliability being exhibited.

On the other hand, when the thermosetting adhesive materials of Comparative Examples 1 to 3 and 5 and 6 are used, Rational Formula 1 is satisfied, but not Relational Formula 2, and when the thermosetting adhesive material of Comparative Example 4 is used, Relational Formula 1 and Relational Formula 2 cannot both be satisfied at the same time. Consequently, initial resistance is good, but the resistance after 200 hours of PCT increases, and connection reliability becomes poor.

With the thermosetting adhesive material of the present invention, connection terminals provided on the opposing sides of a pair of opposing substrates can be connected with good connection reliability, and an insulating inorganic filler can be contained without decreasing the toughness parameters.

The entire disclosure of the specification, claims and drawing of Japanese Patent Application No. 11-350800 filed on Dec. 9, 1999 is hereby incorporated by reference.

What is claimed is:

1. A thermosetting adhesive material for connecting connection terminals provided on the opposing sides of a pair of opposing substrates, said thermosetting adhesive material containing electroconductive particles for anisotropic electroconductive connection, a thermosetting resin and an insulating inorganic filler, wherein the insulating inorganic filler content (a; vol %) and the elastic modulus of the thermosetting adhesive material after curing (E; Gpa/30 C) satisfy the following relational formula (1):

$$0.042a+0.9<E<0.106a+2.5 \tag{1}$$

and at the same time, the insulating inorganic filler content (a; vol %) and the tensile elongation (d; %) at 25° C. of the thermosetting adhesive material after curing satisfy the following relational formula (2)

$$-0.072a+4<d<0.2632a+13 \tag{2}.$$

2. The thermosetting adhesive material according to claim 1, wherein the insulating inorganic filler content (a) is 5 to 35 vol %.

3. The thermosetting adhesive material according to claim 1, wherein the insulating inorganic filler is alumina or silica.

4. The thermosetting adhesive material according to claim 1, wherein the electroconductive particles for anisotropic electroconductive connection are present in a proportion of 0.5 to 20 vol %.

5. The thermosetting adhesive material according to claim 2, wherein the insulating inorganic filler is alumina or silica.

6. The thermosetting adhesive material according to claim 2, wherein the electroconductive particles for anisotropic electroconductive connection are present in a proportion of 0.5 to 20 vol %.

7. The thermosetting adhesive material according to claim 3, wherein the electroconductive particles for anisotropic electroconductive connection are present in a proportion of 0.5 to 20 vol %.

* * * * *